US012768907B2

(12) United States Patent
Gururaja Rao

(10) Patent No.: US 12,768,907 B2
(45) Date of Patent: Oct. 20, 2026

(54) SYSTEM AND METHOD FOR DETECTING A FAULTY CONNECTION IN AN EARTH GRID OR AN EQUIPMENT

(71) Applicant: JEF TECHNO SOLUTIONS PVT LTD, Bangalore (IN)

(72) Inventor: Prashanth Belur Gururaja Rao, Bangalore (IN)

(73) Assignee: JEF TECHNO SOLUTIONS PVT LTD, Bangalore (IN)

( * ) Notice: Subject to any disclaimer, the term of this patent is extended or adjusted under 35 U.S.C. 154(b) by 107 days.

(21) Appl. No.: 18/998,240

(22) PCT Filed: Jul. 29, 2023

(86) PCT No.: PCT/IN2023/050731
§ 371 (c)(1),
(2) Date: Jan. 24, 2025

(87) PCT Pub. No.: WO2024/023853
PCT Pub. Date: Feb. 1, 2024

(65) Prior Publication Data
US 2026/0243850 A1 Aug. 20, 2026

(51) Int. Cl.
*G01R 19/00* (2006.01)
*G01R 31/66* (2020.01)

(52) U.S. Cl.
CPC .................................... *G01R 31/66* (2020.01)

(58) Field of Classification Search
CPC ...................................................... G01R 31/66
See application file for complete search history.

(56) References Cited

U.S. PATENT DOCUMENTS

2020/0021103 A1* 1/2020 Frampton .............. H02M 7/72
2021/0313828 A1* 10/2021 Brombach ............. B60L 55/00

* cited by examiner

*Primary Examiner* — Alesa Allgood

(57) ABSTRACT

A system for detecting a faulty connection in an earth grid (104) or an equipment, which includes a plurality of equipment (102A-B), a current injection device (110) and a plurality of current measuring devices (116, 118). A first reference riser (106A) and a second riser (108) receive a first input current from the current injection device and provide the first input current to the earth grid. The second riser receives a second input current from the current injection device and provide the second input current to the second riser under test. The plurality of current measuring devices includes a first current measuring device that measures a first current and a second current measuring device that measures a second current. The system compares the first current, the second current, the first input current, and the second input current and determines a faulty connection in the earth grid or the equipment.

15 Claims, 8 Drawing Sheets

SYSTEM AND METHOD FOR DETECTING A FAULTY CONNECTION IN AN EARTH GRID OR AN EQUIPMENT

BACKGROUND

Technical Field

The embodiments herein generally relate to detection of a faulty connection in an earth grid or an equipment, and more particularly, to a system and method for detecting the faulty connections in the earth grid or the equipment using a current injection device and a current measuring device.

Description of the Related Art

In an electrical system, a grid connection from electric substations is permanently buried under the ground and it is not easily accessible. Accident typically happens when people come in contact with an equipment connected to the buried earth grid where such connections have breakage/damage. The breakage in the earth grid buried under the ground may cause major accident during the damage in the earth grid.

The existing system gauges a damage in the earth grid (i.e. riser) by measuring an effective resistance between the earth grid and the equipment. The drawback of the existing system is that it is not possible to identify which riser is defective and the riser is defective at the equipment or at the earth grid. Further, it is very important to detect a faulty connection in the system which has only one riser in between the equipment and the earth grid as there are no other riser which are connected to the equipment and the earth grid. If there is a damage/breakage in the single riser system, the chances of accidents and causalities are very high.

As mentioned, there remains a need for a system or a method to detect a faulty connection in the earth grid or the equipment, especially the system has single riser.

SUMMARY

In view of the foregoing, an embodiment herein provides a system for detecting a faulty connection in an earth grid or an equipment. The system includes an earth grid, a plurality of equipment, a current injection device and a plurality of current measuring devices. The plurality of equipment is connected to the earth grid. The plurality of equipment includes a first equipment and a second equipment. The first equipment is connected to the earth grid through a plurality of first risers. The second equipment is connected to the earth grid through a second riser. The current injection device includes a frequency converter and a current unit. The frequency converter modifies an input current with grid frequency into an input current with off grid frequency. The current unit regulates the input current with off grid frequency into a variable input current with off grid frequency. When the current injection device is electrically connected to (i) a first reference riser from the plurality of the first risers at a first current injection point and (ii) the second riser at a second current injection point, the first reference riser and the second riser receive a first input current with off-grid frequency from the current injection device and provide the first input current with off-grid frequency to the earth grid for detecting a faulty connection using the second riser that is under test. When the current injection device is electrically connected to (i) the second equipment or a body of the second equipment at a third current injection point and (ii) the second riser at the second current injection point, the second equipment or the body of the second equipment and the second riser receive a second input current with off grid frequency from the current injection device and provide the second input current with off-grid frequency to the second riser under test for detecting a faulty connection in the second equipment or the body of the equipment using the second riser that is under test. The plurality of current measuring devices includes a first current measuring device and a second current measuring device. The first current measuring device is connected to the second riser below the second current injection point and the second current measuring device is connected to the second riser above the second current injection point. The first current measuring device measures a first current that is received by the second riser from the earth grid and the second current measuring device measures a second current that is received by the second riser from the second equipment or the body of the second equipment. The system compares the first current, the second current, the first input current, and the second input current and determines a faulty connection in (i) the second equipment if at least one of (a) the second current that is received by the second riser under test from the body of the second equipment is below the first current that is received by the second riser under test from the earth grid, (b) the second current that is received by the second riser under test from the second equipment is below the second input current that is provided to the body of the second equipment, or (c) the second current that is received by the second riser under test from the body of the second equipment is zero, and (ii) the earth grid if at least one of (a) the first current that is received by the second riser under test from the earth grid is below the second current that is received by the second riser under test from the body of the second equipment, (b) the first current that is received by the second riser under test from the earth grid is below the first input current that is provided to the earth grid, or (c) the first current that is received by the second riser under test from the earth grid is zero.

In some embodiments, the system determines a location of the faulty connection in the second equipment or the body of the second equipment more accurately by (i) changing the third current injection point to a pole structure of the second equipment above a first termination point where the second riser is terminated, (ii) providing the second input current with off-grid frequency at the third current injection point and to the second current injection point, (iii) measuring, using the second current measuring device, the second current that is received by the second riser from the pole structure of the second equipment, and (iv) comparing at least two of the first current, the second current and the second input current to determine a faulty connection in the first termination point.

In some embodiments, the system determines a location of the faulty connection in the second equipment or the body of the second equipment more accurately by (i) changing (a) the third current injection point to a frame of the second equipment above a second termination point where a pole structure is bonded with the frame and (b) the second current injection point to the pole structure below the second termination point, (ii) providing the second input current with off-grid frequency to (a) the frame of the second equipment and (b) the pole structure which acts a riser under test, (iii) measuring, using the second current measuring device, the second current that is received by the pole structure from the frame of the second equipment, and (iv) comparing at least two of the first current, the second current, and the second input current to determine a faulty connection in the second termination point.

In some embodiments, the system determines a location of the faulty connection in the second equipment or the body of the second equipment more accurately by (i) changing the second current injection point to the frame of the second equipment below a third termination point where the frame is bonded with the second equipment, (ii) providing the second input current with off-grid frequency to (a) the second equipment and (b) the frame of the second equipment which acts a riser under test, (iii) measuring, using the second current measuring device, the second current that is received by the frame of the second equipment from the second equipment, and (iv) comparing at least two of the first current, the second current, and the second input current to determine a faulty connection in the third termination point.

In some embodiments, the current injection device is electrically connected to the frame of the second equipment or the pole structure of the second equipment at the third current injection point for providing the second input current with off-grid frequency.

In some embodiments, the first input current or the second input current ranges from 1 ampere to 20 amperes. In some embodiments, the first input current or the second input current ranges from 1 ampere to 40 amperes. In some embodiments, the first input current or the second input current comprise an alternate current (AC) or a direct current (DC). In some embodiments, the first reference riser is a conductor that connects the current injection device and the earth grid.

In some embodiments, the first reference riser is a node taken from the earth grid to provide the first input current from the current injection device to the earth grid. The second riser is a node taken from the second equipment or the body of the second equipment to provide the second input current from the current injection device to the second equipment or the body of the second equipment.

In some embodiments, the second riser under test is a conductor that is connected with (i) the second equipment or the body of the second equipment to receive the second input current from the second equipment or the body of the second equipment and (ii) the earth grid to receive the first input current from the earth grid. The second input current from the second equipment or the body of the second equipment and the first input current from the earth grid are provided to the first current measuring device and the second current measuring device for measuring the first current and the second current respectively.

In an aspect, an embodiment herein provides a method for detecting a faulty connection in an earth grid or an equipment. The earth grid is connected to a plurality of equipment. The plurality of equipment comprises a first equipment or a second equipment. The first equipment is connected to the earth grid through a plurality of first risers and the second equipment from the plurality of equipment is connected to the earth grid through a second riser. The method includes (i) modifying, using a frequency converter of a current injection device of a system, an input current with grid frequency into an input current with off grid frequency, (ii) regulating, using a current unit of the current injection device, the input current with off grid frequency into a variable input current with off grid frequency, (iii) receiving, using a first reference riser and a second riser of the system, a first input current with off-grid frequency from a current injection device and providing the first input current with off-grid frequency to an earth grid for detecting a faulty connection using the second riser that is under test when the current injection device is electrically connected to (a) the first reference riser from the plurality of the first risers at a first current injection point and (b) the second riser at a second current injection point, (iv) receiving, using a second equipment or a body of the second equipment and the second riser of the system, a second input current with off grid frequency from the current injection device and providing the second input current with off-grid frequency to the second riser under test for detecting a faulty connection in the second equipment or the body of the equipment using the second riser that is under test when the current injection device is electrically connected to (a) a second equipment or a body of the second equipment at a third current injection point and (b) the second riser at the second current injection point, (v) measuring, using a first current measuring device of the system, a first current that is received by the second riser from the earth grid, (vi) measuring, using a second current measuring device of the system, a second current that is received by the second riser from the second equipment or the body of the second equipment and (vii) comparing, using the system, the first current, the second current, the first input current, and the second input current and determining a faulty connection in (i) the second equipment if at least one of (a) the second current that is received by the second riser under test from the body of the second equipment is below the first current that is received by the second riser under test from the earth grid, (b) the second current that is received by the second riser under test from the second equipment is below the second input current that is provided to the body of the second equipment, or (c) the second current that is received by the second riser under test from the body of the second equipment is zero, and (ii) the earth grid if at least one of (a) the first current that is received by the second riser under test from the earth grid is below the second current that is received by the second riser under test from the body of the second equipment, (b) the first current that is received by the second riser under test from the earth grid is below the first input current that is provided to the earth grid, or (c) the first current that is received by the second riser under test from the earth grid is zero.

In some embodiments, the method comprises determining, using the system, a location of the faulty connection in the second equipment or the body of the second equipment more accurately by (i) changing the third current injection point to a pole structure of the second equipment above a first termination point where the second riser is terminated, (ii) providing the second input current with off-grid frequency at the third current injection point and to the second current injection point, (iii) measuring, using the second current measuring device, the second current that is received by the second riser from the pole structure of the second equipment, and (iv) comparing at least two of the first current, the second current and the second input current to determine a faulty connection in the first termination point.

In some embodiments, the method comprises determining, using the system, a location of the faulty connection in the second equipment or the body of the second equipment more accurately by (i) changing (a) the third current injection point to a frame of the second equipment above a second termination point where a pole structure is bonded with the frame and (b) the second current injection point to the pole structure below the second termination point, (ii) providing the second input current with off-grid frequency to (a) the frame of the second equipment and (b) the pole structure which acts a riser under test, (iii) measuring, using the second current measuring device, the second current that is received by the pole structure from the frame of the second equipment, and (iv) comparing at least two of the first current, the second current, and the second input current to determine a faulty connection in the second termination point.

In some embodiments, the method comprises determining, using the system, a location of the faulty connection in the second equipment or the body of the second equipment more accurately by (i) changing the second current injection point to the frame of the second equipment below a third termination point where the frame is bonded with the second equipment, (ii) providing the second input current with off-grid frequency to (a) the second equipment and (b) the frame of the second equipment which acts a riser under test, (iii) measuring, using the second current measuring device, the second current that is received by the frame of the second equipment from the second equipment, and (iv) comparing at least two of the first current, the second current, and the second input current to determine a faulty connection in the third termination point.

In some embodiments, the method comprises electrically connecting the current injection device to the frame of the second equipment or the pole structure of the second equipment at the third current injection point for providing the second input current with off-grid frequency.

The system detects the faulty connection in the earth grid or the equipment more accurately. The system may detect the faulty connection in the earth grid or the equipment during a flow of current in the earth grid/equipment or when the earth grid/equipment is in a working condition. The system provides low input current to the earth grid/equipment, thereby avoiding the damages in the equipment/earth grid and avoid accidents while detecting the faulty connection. The low current can be provided to the earth grid/equipment even when the high current is passing through the earth grid/equipment without shutting down the high current in the earth grid. The low current with off grid frequency provided to the earth grid/equipment for detecting the faulty connection without disturbing the high current in the earth grid/equipment with a grid frequency. When the faulty connection is detected, an area of the faulty connection below/above ground is excavated or identified and the connection in the area is repaired.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1A:
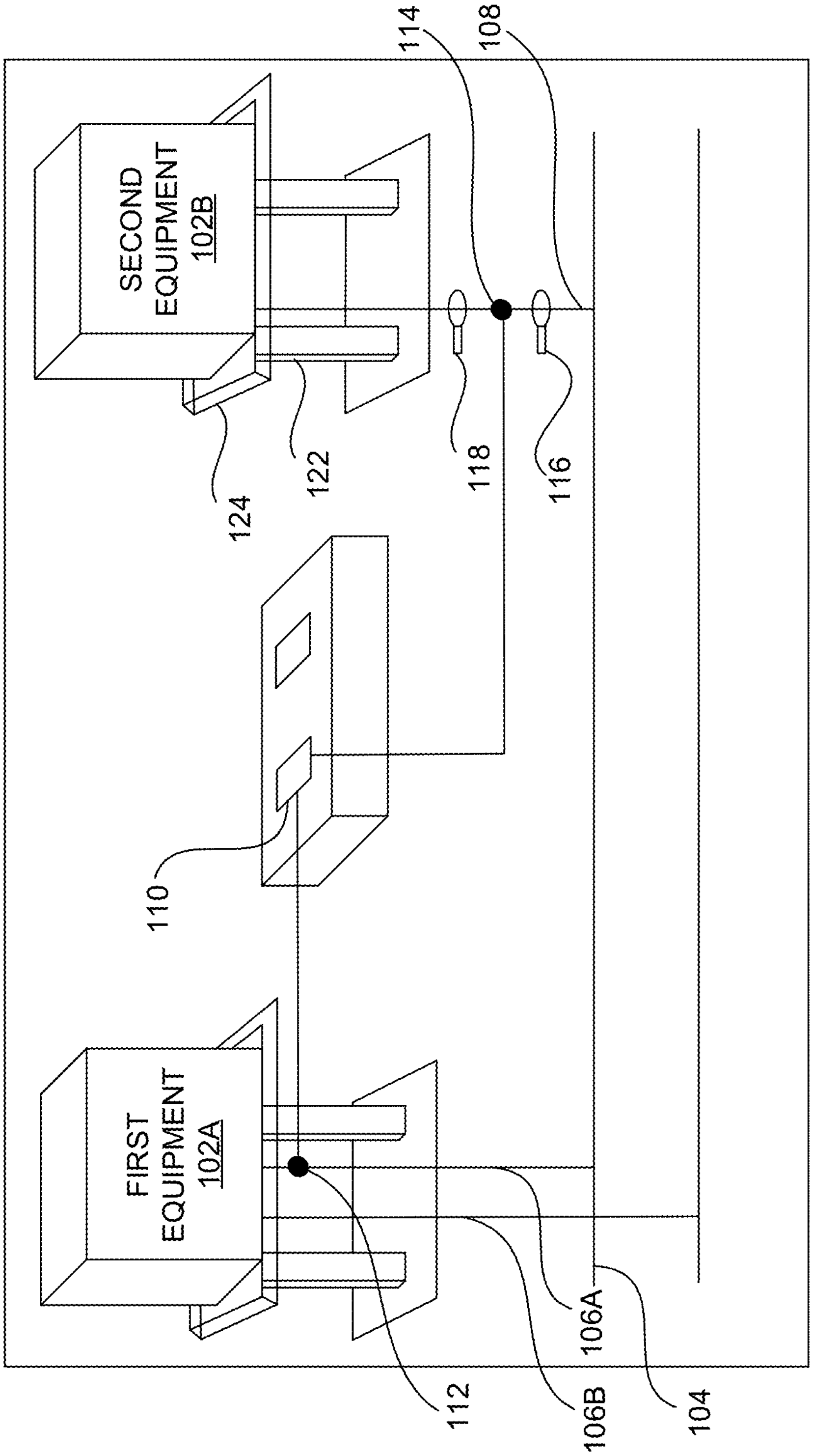
FIGS. 1A-1B are exploded views of a system for detecting a faulty connection in an earth grid or an equipment having a single riser (i.e. a second riser) according to some embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a system and method for detecting the faulty connections in the earth grid or the equipment using a current injection device and a current measuring device. The embodiments herein achieve this by providing a low input current to the earth grid to detect the faulty connections in the earth grid or the equipment even when the high current is flown in the earth grid. Referring now to the drawings, and more particularly to FIGS. 1 to 6B, where similar reference characters denote corresponding features consistently throughout the figures, preferred embodiments are shown.

Figure 1B:
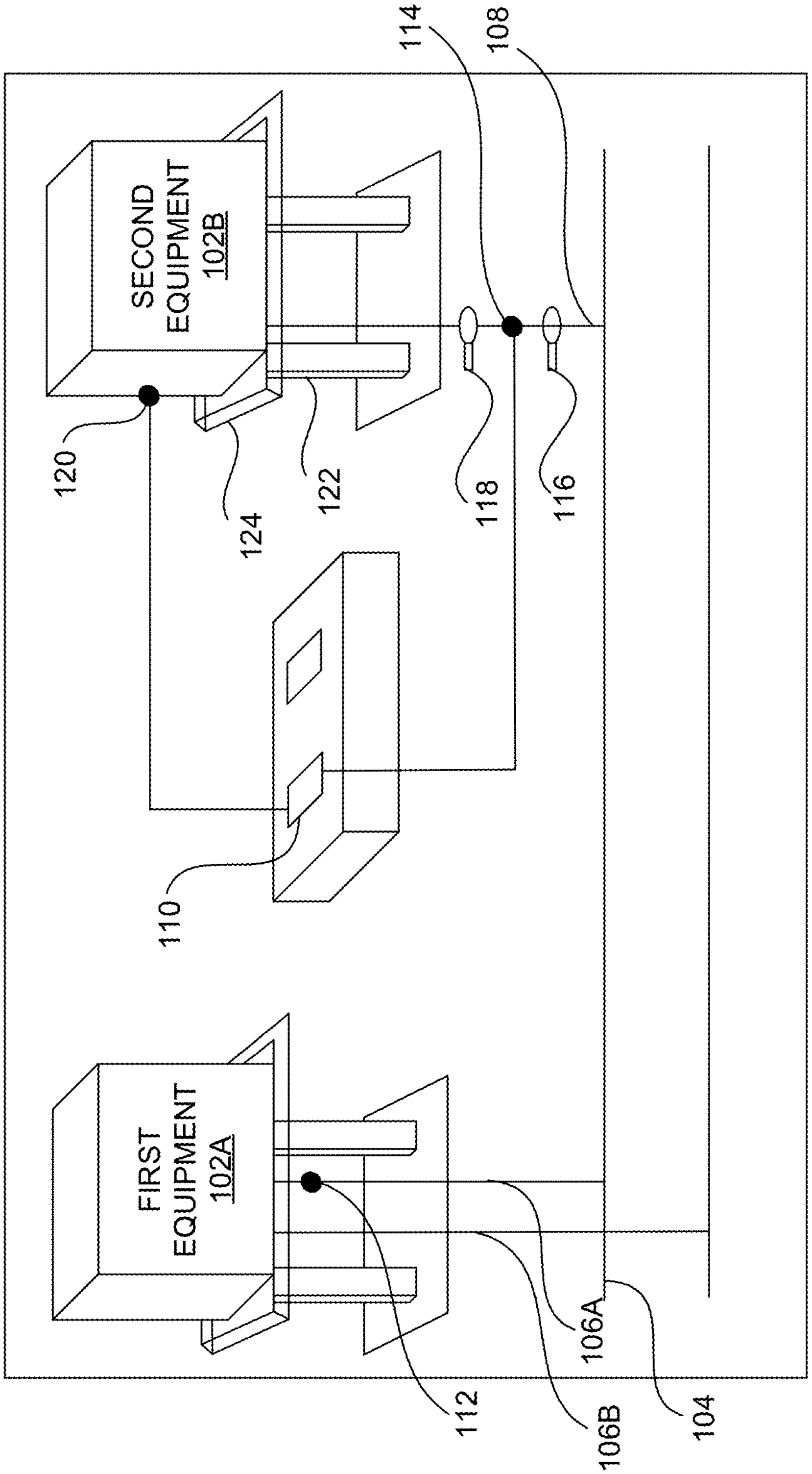

FIGS. 1A-1B are exploded views of a system for detecting a faulty connection in an earth grid 104 or an equipment having a single riser (i.e. a second riser 108) according to some embodiments herein. The system includes an earth grid 104, a plurality of equipment 102A-B, a current injection device 110 and a plurality of current measuring devices (116, 118). The plurality of equipment 102A-B is connected to the earth grid 104. The plurality of equipment 102A-B includes a first equipment 102A and a second equipment 102B. The first equipment 102A is connected to the earth grid 104 through a plurality of first risers 106A-B. The second equipment 102B is connected to the earth grid 104 through a second riser 108. The current injection device 110 includes a frequency converter and a current unit. The frequency converter modifies an input current with grid frequency into an input current with off grid frequency. The current unit regulates the input current with off grid frequency into a variable input current with off grid frequency. When the current injection device 110 is electrically connected to (i) a first reference riser 106A from the plurality of the first risers 106A-B at a first current injection point 112 and (ii) the second riser 108 at a second current injection point 114, the first reference riser 106A and the second riser 108 receive a first input current with off-grid frequency from the current injection device 110 and provide the first input current with off-grid frequency to the earth grid 104 for detecting a faulty connection using the second riser 108 that is under test. When the current injection device 110 is electrically connected to (i) the second equipment 102B or a body of the second equipment 102B at a third current injection point 120 and (ii) the second riser 108 at the second current injection point 114, the second equipment 102B or the body of the second equipment 102B and the second riser 108 receive a second input current with off grid frequency from the current injection device 110 and provide the second input current with off-grid frequency to the second riser 108 under test for detecting a faulty connection in the second equipment 102B or the body of the second equipment 102B using the second riser 108 that is under test. The plurality of current measuring devices (116, 118) includes a first current measuring device 116 and a second current measuring device 118. The first current measuring device 116 is connected to the second riser 108 below the second current injection point 114 and the second current measuring device 118 is connected to the second riser 108 above the second current injection point 114. The first current measuring device 116 measures a first current that is received by the second riser 108 from the earth grid 104 and the second current measuring device 118 measures a second current that is received by the second riser 108 from the second equipment 102B or the body of the second equipment 102B. The system compares the first current, the second current, the first input current, and the second input current and determines a faulty connection in (i) the second equipment 102B if at least one of (a) the second current that is received by the second riser 108 under test from the body of the second equipment 102B is below the first current that is received by the second riser 108 under test from the earth grid 104, (b) the second current that is received by the second riser 108 under test from the second equipment 102B is below the second input current that is provided to the body of the second equipment 102B, or (c) the second current that is received by the second riser 108 under test from the body of the second equipment 102B is zero, and (ii) the earth grid 104 if at least one of (a) the first current that is received by the second riser 108 under test from the earth grid 104 is below the second current that is received by the second riser 108 under test from the body of the second equipment 102B, (b) the first current that is received by the second riser 108 under test from the earth grid 104 is below the first input current that is provided to the earth grid 104, or (c) the first current that is received by the second riser 108 under test from the earth grid 104 is zero.

In some embodiments, the first current injection point 112 is a point in the first reference riser 106A at which a first input current is injected by the current injection device 110. In some embodiments, the second current injection point 114 is a point in the second riser 108 or a pole structure/a frame of the second equipment 102B at which the second input current is injected by the current injection device 110. In some embodiments, the third current injection point 120 is a point in the second equipment 102B or a pole structure/a frame of the second equipment 102B at which a second input current is injected by the current injection device 110.

In some embodiments, the body of the second equipment 102B may be a frame 124, a pole structure 122, an equipment, or any suitable means of connecting the second equipment 102B to the second riser 108.

In some embodiments, the first input current or the second input current ranges from 1 ampere to 20 amperes. In some embodiments, the first input current or the second input current ranges from 1 ampere to 40 amperes. In some embodiments, the first input current or the second input current ranges from 400 amperes. In some embodiments, the first input current or the second input current comprises an alternate current (AC) or a direct current (DC). In some embodiments, the first reference riser 106A is a conductor that connects the current injection device 110 and the earth grid 104.

In some embodiments, the first reference riser 106A is a node taken from the earth grid 104 to provide the first input current from the current injection device 110 to the earth grid 104. The second riser 108 is a node taken from the second equipment 102B or the body of the second equipment 102B to provide the second input current from the current injection device 110 to the second equipment 102B or the body of the second equipment 102B.

In some embodiments, the second riser 108 under test is a conductor that is connected with (i) the second equipment 102B or the body of the second equipment 102B to receive the second input current from the second equipment 102B or the body of the second equipment 102B and (ii) the earth grid 104 to receive the first input current from the earth grid 104. The second input current from the second equipment 102B or the body of the second equipment 102B and the first input current from the earth grid 104 are provided to the first current measuring device 116 and the second current measuring device 118 for measuring the first current and the second current respectively.

In some embodiments, the system may include a temporary riser that is connected to the second equipment 102B and a reference riser of a third equipment of the plurality of equipment during testing. When the current injection device 110 injects the second current to the second riser 108 on the second equipment 102B, the first current measuring device 116 that is connected to the second riser 108 measures the first current received by the second riser from the earth grid 104 below and the second current measuring device 118 that is implemented on the second riser 108 measures the second current received from the second equipment 102B and the temporary riser that is connected to the second equipment 102B. The system then compares the first current and the second current that are measured and detects a faulty connection in the second equipment 102B if the first current measured is lesser than the second current or vice versa.

In some embodiment, the second equipment 102B has a first pole structure and a second pole structure. When the second equipment 102B is not accessible for testing, the system detects a faulty connection in the second equipment 102B by injecting the second input current at the second injection point in the first pole structure and measuring the current received by the second pole structure using the current measuring device.

The plurality of equipment 106A-B is connected with the earth grid 104 to receive a current from electrical substations. In some embodiments, the current may be a grid current. In some embodiments, the earth grid 104 is buried under the earth to dissipate fault currents flowing in from above grade steel structures. In some embodiments, the current from the electrical substations flows to the plurality of equipment 106A-B through the earth grid 104. The plurality of equipment 106A-B may be any of: current transformer, potential transformer, machines, motors, and the like. In some embodiments, the plurality of equipment 106A-B connected with the earth grid 104 receives lesser current with low voltage if there is some breakage in the earth grid 104. The system detects the faulty connection in the riser under test that is connected to the earth grid 104 buried under the earth using the current injection device 110 and the current measuring devices (116, 118). In some embodiments, the earth grid 104 is made of at least one of copper or aluminium. The system detects the faulty connection in the riser under test that is connected to the earth grid 104 without disturbing or shutting down the grid current.

The current injection device 110 is connected with the earth grid 104 to provide a low input current to detect the faulty connection in the earth grid 104 buried under the earth without excavating. In some embodiments, the current injection device 110 receives an input current (e.g. the first input current and the second input current) from an electrical grid connected with the substations. In some embodiments, the system includes a voltage regulator that is used to monitor a flow of the input current (e.g. the first input current and the second input current) with off grid frequency and to regulate the voltage. In some embodiments, the voltage regulator includes a capacitor to regulate the voltage.

In some embodiments, the grid frequency and the off-grid frequency is different for providing the low input current to the earth grid 104 when the high grid current is flowing in the earth grid 104.

The system detects that the riser (e.g. the second riser 108) that is under test is weakly connected with the equipment if the second current is below the first current. The system detects that the riser (e.g. the second riser 108) that is under test is weakly connected with the earth grid 104 if the first current is below the second current. The system detects that the riser (e.g. the second riser 108) that is under test is open towards the second equipment 102B or the earth grid 104 if the second current or the first current is zero. In some embodiments, the first and second currents are measured with an increased excitation voltage to determine an extent of weakness of the connection. In some embodiments, the voltage drop is also measured along with the first and second currents to accurately determine a condition of the riser that is under test.

Figure 2:
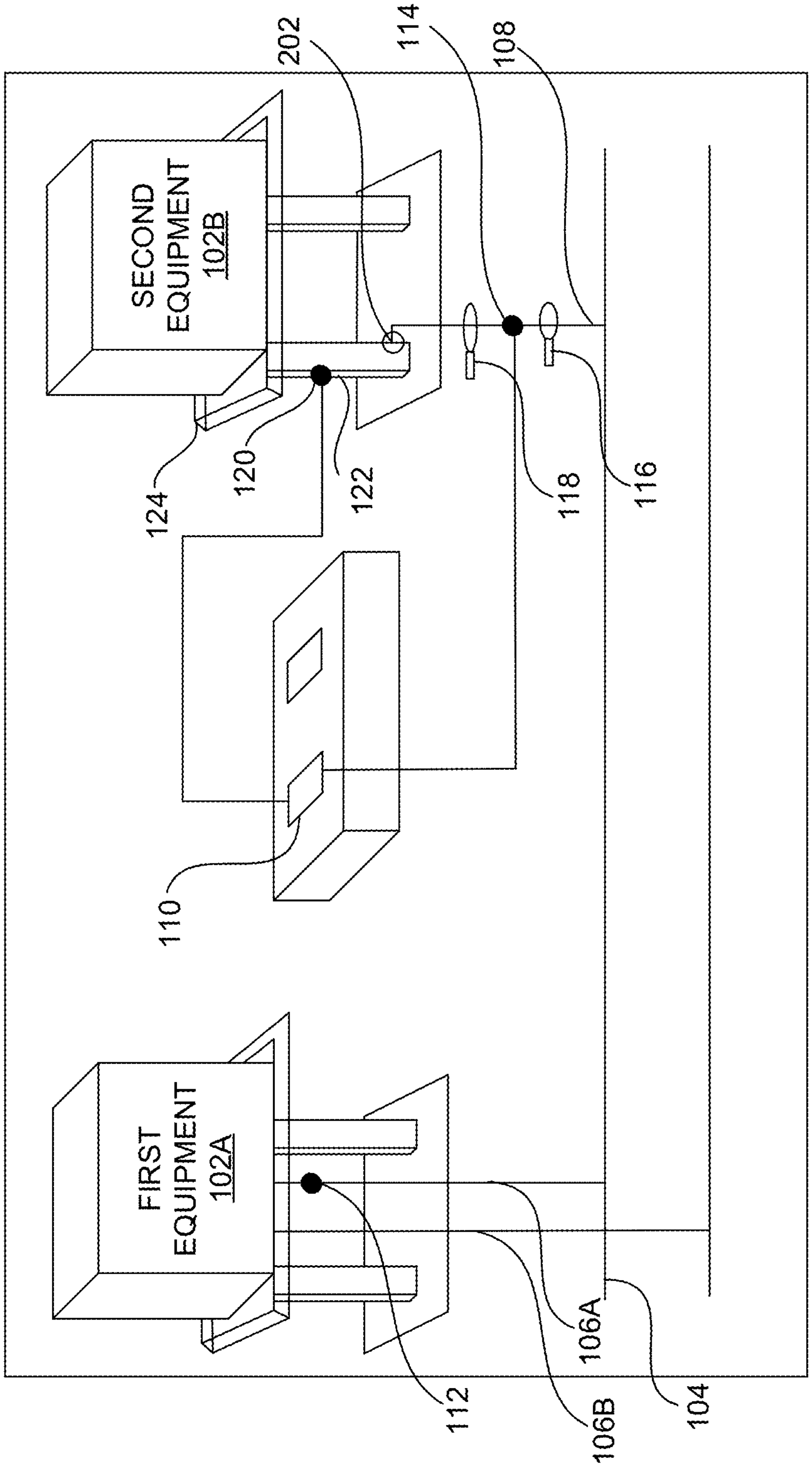
FIG. 2 is an exploded view of the system of FIG. 1 that detects a faulty connection in a first termination point of the equipment (i.e. a second equipment) having a single riser (i.e. a second riser) according to some embodiments herein.

FIG. 2 is an exploded view of the system of FIG. 1 that detects a faulty connection in a first termination point 202 of the equipment (i.e. a second equipment 102B) having a single riser (i.e. a second riser 108) according to some embodiments herein. The system determines a location of the faulty connection in the second equipment 102B or the body of the second equipment 102B more accurately by (i) changing the third current injection point 120 to a pole structure 122 of the second equipment 102B above a first termination point 202 where the second riser 108 is terminated, (ii) providing the second input current with off-grid frequency at the third current injection point 120 and to the second current injection point 114, (iii) measuring, using the second current measuring device 118, the second current that is received by the second riser 108 from the pole structure 122 of the second equipment 102B, and (iv) comparing at least two of the first current, the second current and the second input current to determine a faulty connection in the first termination point 202.

In some embodiments, the first termination point 202 is a termination point at which the second riser 108 is terminated on the pole structure 122 of the second equipment 102B.

Figure 3:
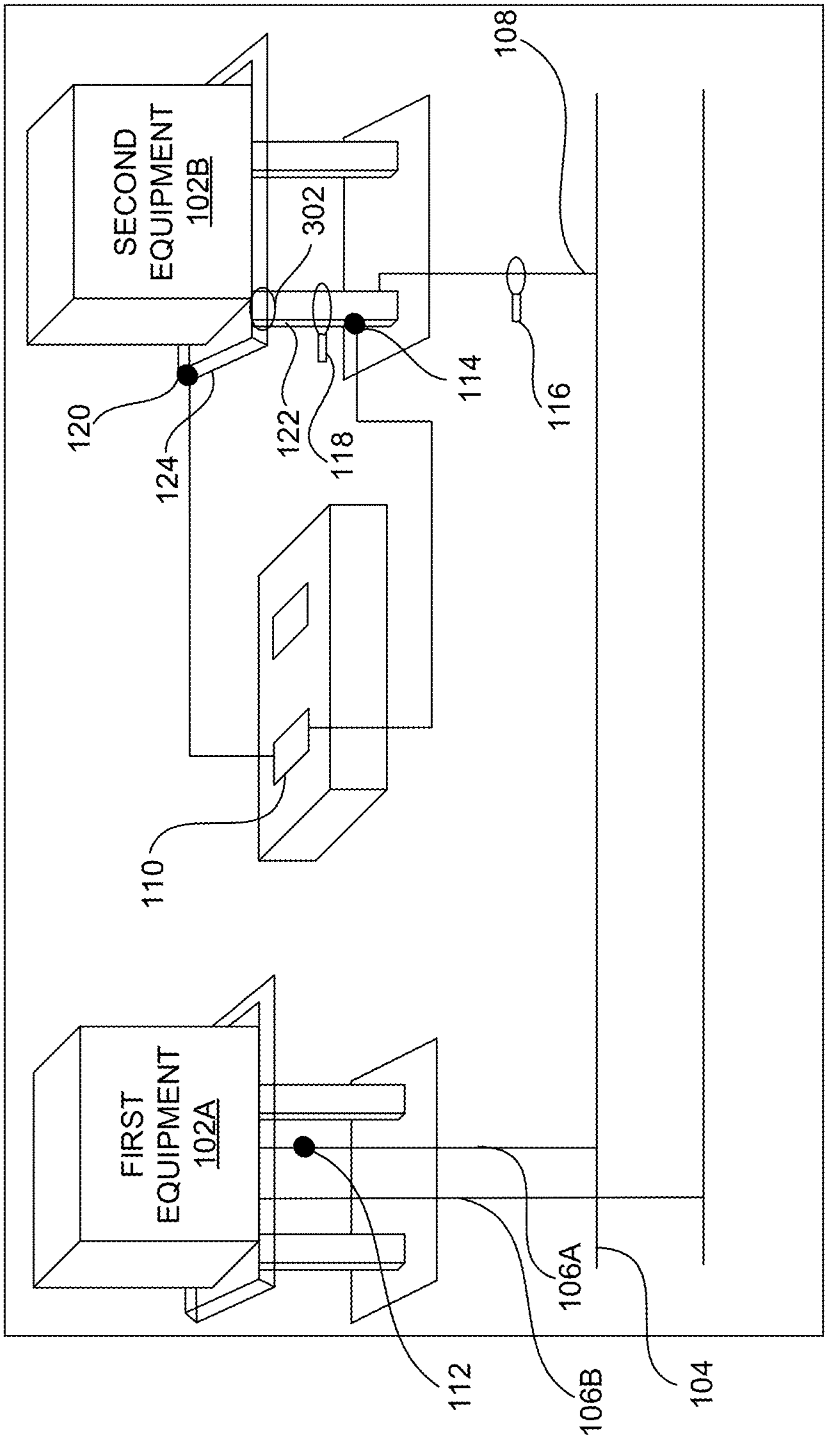
FIG. 3 is an exploded view of the system of FIG. 1 that detects a faulty connection in a second termination point of the equipment (i.e. a second equipment) having a single riser (i.e. a second riser) according to some embodiments herein.

FIG. 3 is an exploded view of the system of FIG. 1 that detects a faulty connection in a second termination point 302 of the equipment (i.e. a second equipment 102B) having a single riser (i.e. a second riser 108) according to some embodiments herein. The system determines a location of the faulty connection in the second equipment 102B or the body of the second equipment 102B more accurately by (i) changing (a) the third current injection point 120 to a frame 124 of the second equipment 102B above a second termination point 302 where a pole structure 122 is bonded with the frame 124 and (b) the second current injection point 114 to the pole structure 122 below the second termination point 302, (ii) providing the second input current with off-grid frequency to (a) the frame 124 of the second equipment 102B and (b) the pole structure 122 which acts a riser under test, (iii) measuring, using the second current measuring device 118, the second current that is received by the pole structure 122 from the frame 124 of the second equipment 102B, and (iv) comparing at least two of the first current, the second current, and the second input current to determine a faulty connection in the second termination point 302.

In some embodiments, the second termination point 302 is a termination point at which the pole structure 122 of the second equipment 102B is bonded with the frame 124 of the second equipment 102B.

Figure 4:
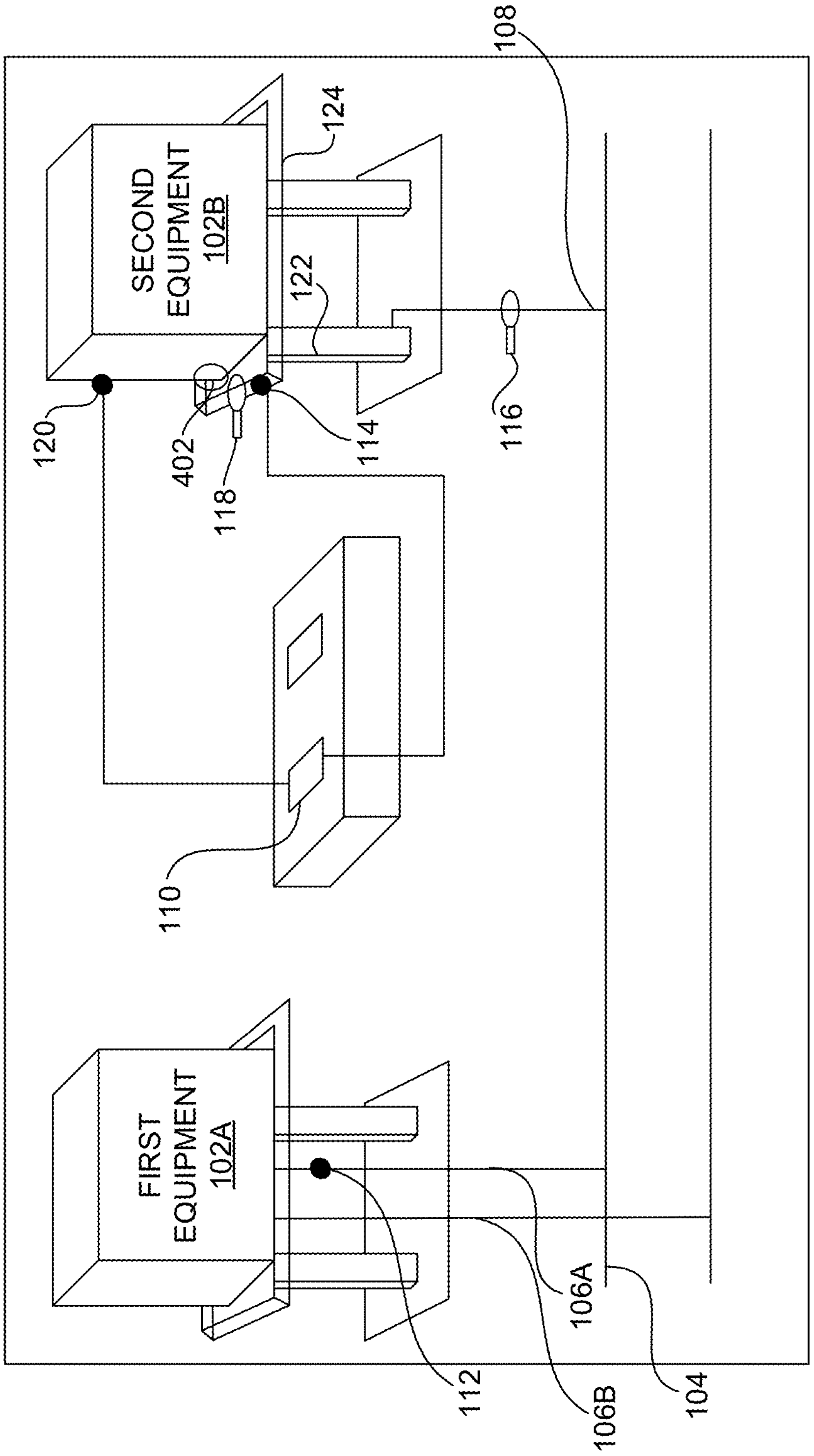
FIG. 4 is an exploded view of the system of FIG. 1 that detects a faulty connection in a third termination point of the equipment (i.e. a second equipment) having a single riser (i.e. a second riser) according to some embodiments herein.

FIG. 4 is an exploded view of the system of FIG. 1 that detects a faulty connection in a third termination point 402 of the equipment (i.e. a second equipment 102B) having a single riser (i.e. a second riser 108) according to some embodiments herein. The system determines a location of the faulty connection in the second equipment 102B or the body of the second equipment 102B more accurately by (i) changing the second current injection point 114 to the frame 124 of the second equipment 102B below a third termination point 402 where the frame 124 is bonded with the second equipment 102B, (ii) providing the second input current with off-grid frequency to (a) the second equipment 102B and (b) the frame 124 of the second equipment 102B which acts a riser under test, (iii) measuring, using the second current measuring device 118, the second current that is received by the frame 124 of the second equipment 102B from the second equipment 102B, and (iv) comparing at least two of the first current, the second current, and the second input current to determine a faulty connection in the third termination point 402.

In some embodiments, the third termination point 402 is a termination point at which the frame 124 of the second equipment 102B is bonded with the second equipment 102B.

In some embodiments, the current injection device 110 is electrically connected to the frame 124 of the second equipment 102B or the pole structure 122 of the second equipment 102B at the third current injection point 402 for providing the second input current with off-grid frequency.

Figure 5:
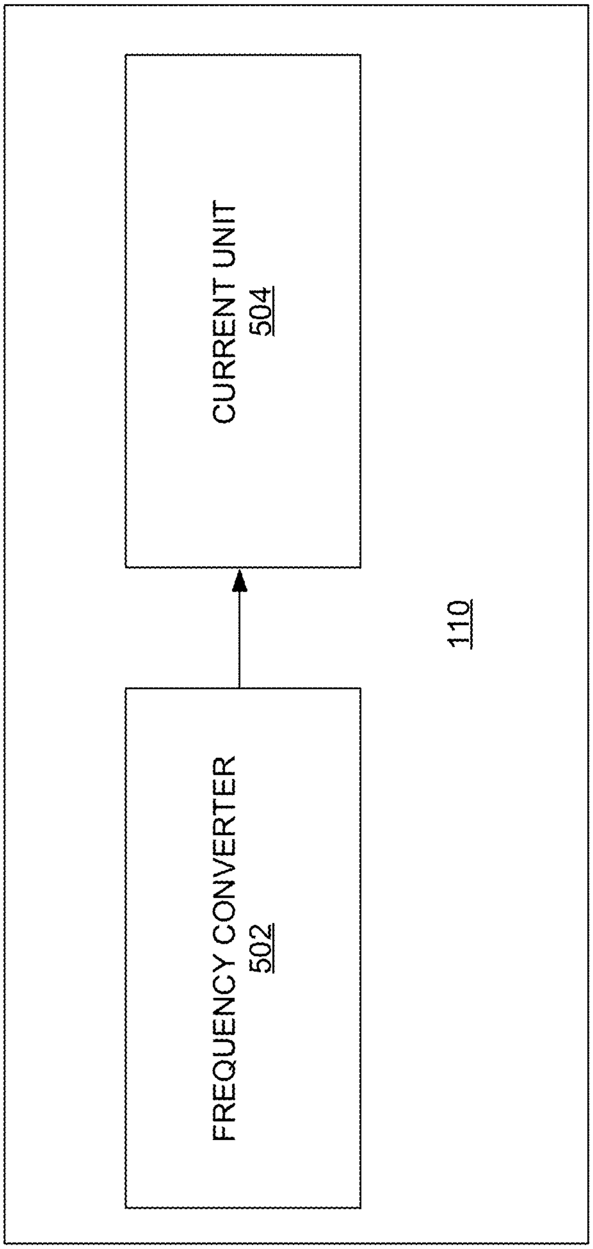
FIG. 5 is a block diagram of the current injection device of FIG. 1 that provides a low input current to the earth grid or the equipment to detect a faulty connection in a riser under test that is connected to the earth grid or the equipment according to some embodiments herein.

FIG. 5 is a block diagram of the current injection device 110 of FIG. 1 that provides a low input current (e.g. a first input current or a second input current) to the earth grid 104 or the equipment (e.g. 106A-B) to detect a faulty connection in a riser under test that is connected to the earth grid 104 or the equipment according to some embodiments herein. The current injection device 110 includes a frequency converter 502 and a current unit 504. The frequency converter 502 receives an input current from an electrical grid connected with electrical substations. In some embodiments, the input current received from the electrical grid is in the grid frequency. The frequency converter 502 modifies the input current with grid frequency into the input current with off-grid frequency. In some embodiments, the grid frequency is modified into the off-grid frequency to provide the input current with off-grid frequency into the earth grid 104 even when the high current is flown in the earth grid 104. The output from the frequency converter 502 is provided to the current unit 504. The current unit 504 regulates the input current with off-grid frequency into the variable input current with off grid frequency. The input current may be varied between a range of 1 ampere to 20 amperes. In some embodiments, the input current with off grid frequency is regulated based on the grid current with grid frequency passing in the earth grid 104. In some embodiments, the regulated input current is provided to the earth grid 104 through a first reference riser 112.

Figure 6A:
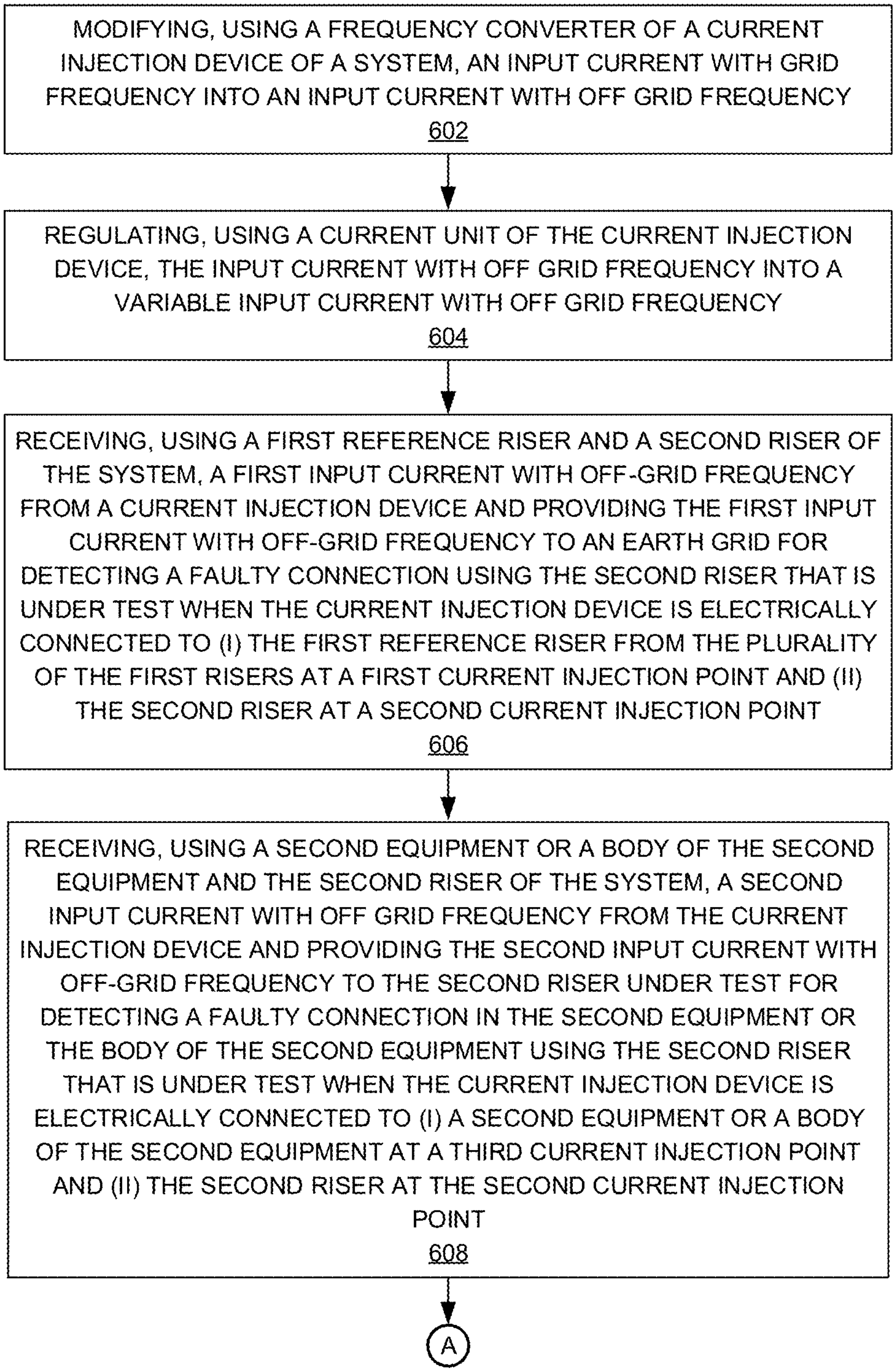
FIGS. 6A-6B are flow diagrams that illustrate a method for detecting a faulty connection in the earth grid or the equipment using the system of FIG. 1 according to some embodiments herein.
Figure 6B:
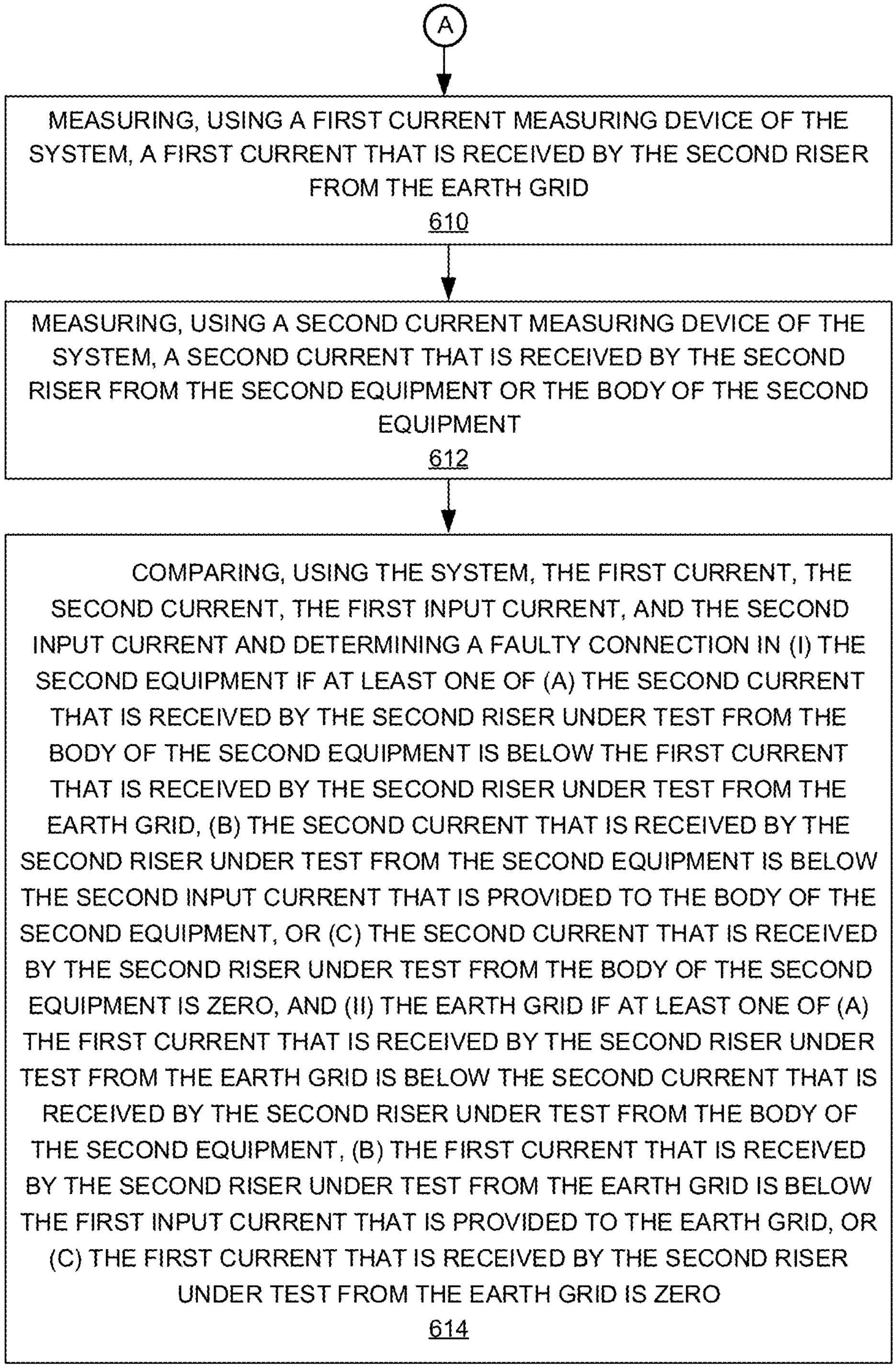

FIGS. 6A-6B are flow diagrams that illustrate a method for detecting a faulty connection in the earth grid 104 or the equipment (i.e. a second equipment 102B) using the system of FIG. 1 according to some embodiments herein. The earth grid is connected to a plurality of equipment 102A-B. The plurality of equipment 102A-B comprises a first equipment 102A or a second equipment 102B. The first equipment 102A is connected to the earth grid 104 through a plurality of first risers 106A-B and the second equipment 102B from the plurality of equipment 102A-B is connected to the earth grid 104 through a second riser 108. At a step 602, an input current with grid frequency is modified, using a frequency converter 502 of a current injection device 110 of a system, into an input current with off grid frequency. At a step 604, the input current with off grid frequency is regulated, using a current unit 504 of the current injection device 110, into a variable input current with off grid frequency. At a step 606, a first input current with off-grid frequency is received, using a first reference riser 106A and a second riser 108 of the system, from a current injection device 110 and providing the first input current with off-grid frequency to an earth grid 104 for detecting a faulty connection using the second riser 108 that is under test when the current injection device 110 is electrically connected to (i) the first reference riser 106A from the plurality of the first risers 106A-B at a first current injection point 112 and (ii) the second riser 108 at a second current injection point 114. At a step 608, a second input current with off grid frequency is received, using a second equipment 102B or a body of the second equipment 102B and the second riser 108 of the system, from the current injection device 110 and providing the second input current with off-grid frequency to the second riser 108 under test for detecting a faulty connection in the second equipment 102B or the body of the second equipment 102B using the second riser 108 that is under test when the current injection device 110 is electrically connected to (i) a second equipment 102B or a body of the second equipment 102B at a third current injection point 120 and (ii) the second riser 108 at the second current injection point 114. At a step 610, a first current that is received by the second riser 108 from the earth grid 104 is measured, using a first current measuring device 116 of the system. At a step 612, a second current that is received by the second riser 108 from the second equipment 102B or the body of the second equipment 102B is measured, using a second current measuring device 118 of the system. At a step 614, the first current, the second current, the first input current, and the second input current is compared, using the system, and determining a faulty connection in (i) the second equipment 102B if at least one of (a) the second current that is received by the second riser 108 under test from the body of the second equipment 102B is below the first current that is received by the second riser 108 under test from the earth grid 104, (b) the second current that is received by the second riser 108 under test from the second equipment 102B is below the second input current that is provided to the body of the second equipment 102B, or (c) the second current that is received by the second riser 108 under test from the body of the second equipment 102B is zero, and (ii) the earth grid 104 if at least one of (a) the first current that is received by the second riser 108 under test from the earth grid 104 is below the second current that is received by the second riser 108 under test from the body of the second equipment 102B, (b) the first current that is received by the second riser 108 under test from the earth grid 104 is below the first input current that is provided to the earth grid 104, or (c) the first current that is received by the second riser 108 under test from the earth grid 104 is zero.

In some embodiments, the method comprises determining, using the system, a location of the faulty connection in the second equipment 102B or the body of the second equipment 102B more accurately by (i) changing the third current injection point 120 to a pole structure 122 of the second equipment 102B above a first termination point 202 where the second riser 108 is terminated, (ii) providing the second input current with off-grid frequency at the third current injection point 120 and to the second current injection point 114, (iii) measuring, using the second current measuring device 118, the second current that is received by the second riser 108 from the pole structure 122 of the second equipment 102B, and (iv) comparing at least two of the first current, the second current and the second input current to determine a faulty connection in the first termination point 202.

In some embodiments, the method comprises determining, using the system, a location of the faulty connection in the second equipment 102B or the body of the second equipment 102B more accurately by (i) changing (a) the third current injection point 120 to a frame 124 of the second equipment 102B above a second termination point 302 where a pole structure 122 is bonded with the frame 124 and (b) the second current injection point 114 to the pole structure 122 below the second termination point 302, (ii) providing the second input current with off-grid frequency to (a) the frame 124 of the second equipment 102B and (b) the pole structure 122 which acts a riser under test, (iii) measuring, using the second current measuring device 118, the second current that is received by the pole structure 122 from the frame 124 of the second equipment 102B, and (iv) comparing at least two of the first current, the second current, and the second input current to determine a faulty connection in the second termination point 302.

In some embodiments, the method comprises determining, using the system, a location of the faulty connection in the second equipment 102B or the body of the second equipment 102B more accurately by (i) changing the second current injection point 114 to the frame 124 of the second equipment 102B below a third termination point 402 where the frame 124 is bonded with the second equipment 102B, (ii) providing the second input current with off-grid frequency to (a) the second equipment 102B and (b) the frame 124 of the second equipment 102B which acts a riser under test, (iii) measuring, using the second current measuring device 118, the second current that is received by the frame 124 of the second equipment 102B from the second equipment 102B, and (iv) comparing at least two of the first current, the second current, and the second input current to determine a faulty connection in the third termination point 402.

In some embodiments, the method comprises electrically connecting the current injection device 110 to the frame 124 of the second equipment 102B or the pole structure 122 of the second equipment 102B at the third current injection point 120 for providing the second input current with off-grid frequency.

The system/method detects the faulty connection in the earth grid 104 or the equipment more accurately. The system/method may detect the faulty connection in the earth grid 104 or the equipment during a flow of current in the earth grid 104/the equipment or when the earth grid 104/the equipment is in a working condition. The system/method provides low input current to the earth grid 104/the equipment, thereby avoiding the damages in the equipment/earth grid 104 and avoid accidents while detecting the faulty connection. The low current can be provided to the earth grid 104/the equipment even when the high current is passing through the earth grid 104/the equipment without shutting down the high current in the earth grid 104. The low current with off grid frequency provided to the earth grid 104/equipment for detecting the faulty connection without disturbing the high current in the earth grid 104/equipment with a grid frequency. When the faulty connection is detected, an area of the faulty connection below/above ground is excavated or identified and the connection in the area is repaired.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the scope of the appended claims.

I claim:

1. A system for detecting a faulty connection in an earth grid (104) or an equipment, wherein the system comprises:

an earth grid (104);

a plurality of equipment (102A-B) that is connected to the earth grid (104), comprises:

a first equipment (102A) that is connected to the earth grid (104) through a plurality of first risers (106A-B); and a second equipment (102B) that is connected to the earth grid (104) through a second riser (108);

a current injection device (110) comprises:

a frequency converter (502) that modifies an input current with grid frequency into an input current with off grid frequency; and a current unit (504) that regulates the input current with off grid frequency into a variable input current with off grid frequency;

wherein when the current injection device (110) is electrically connected to (i) a first reference riser (106A) from the plurality of the first risers (106) at a first current injection point (112) and (ii) the second riser (108) at a second current injection point (114), the first reference riser (106A) and the second riser (108) receive a first input current with off-grid frequency from the current injection device (110) and provide the first input current with off-grid frequency to the earth grid (104) for detecting a faulty connection using the second riser (108) that is under test, wherein when the current injection device (110) is electrically connected to (i) the second equipment (102B) or a body of the second equipment (102B) at a third current injection point (120) and (ii) the second riser (108) at the second current injection point (114), the second equipment (102B) or the body of the second equipment (102B) and the second riser (108) receive a second input current with off grid frequency from the current injection device (110) and provide the second input current with off-grid frequency to the second riser (108) under test for detecting a faulty connection in the second equipment (102B) or the body of the second equipment (102B) using the second riser (108) that is under test; and a plurality of current measuring devices (116, 118) comprising a first current measuring device (116) that is connected to the second riser (108) below the second current injection point (114) and a second current measuring device (118) that is connected to the second riser (108) above the second current injection point (114), wherein the first current measuring device (116) measures a first current that is received by the second riser (108) from the earth grid (104) and the second current measuring device (118) measures a second current that is received by the second riser (108) from the second equipment (102B) or the body of the second equipment (102B), characterized in that, wherein the system compares the first current, the second current, the first input current, and the second input current and determines a faulty connection in (i) the second equipment (102B) if at least one of (a) the second current that is received by the second riser (108) under test from the body of the second equipment (102B) is below the first current that is received by the second riser (108) under test from the earth grid (104), (b) the second current that is received by the second riser (108) under test from the second equipment (102B) is below the second input current that is provided to the body of the second equipment (102B), or (c) the second current that is received by the second riser (108) under test from the body of the second equipment (102B) is zero, and (ii) the earth grid (104) if at least one of (a) the first current that is received by the second riser (108) under test from the earth grid (104) is below the second current that is received by the second riser (108) under test from the body of the second equipment (102B), (b) the first current that is received by the second riser (108) under test from the earth grid (104) is below the first input current that is provided to the earth grid (104), or (c) the first current that is received by the second riser (108) under test from the earth grid (104) is zero.

2. The system as claimed in claim 1, wherein the system determines a location of the faulty connection in the second equipment (102B) or the body of the second equipment (102B) more accurately by (i) changing the third current injection point (120) to a pole structure (122) of the second equipment (102B) above a first termination point (202) where the second riser (108) is terminated, (ii) providing the second input current with off-grid frequency at the third current injection point (120) and to the second current injection point (114), (iii) measuring, using the second current measuring device (118), the second current that is received by the second riser (108) from the pole structure (122) of the second equipment (102B), and (iv) comparing at least two of the first current, the second current and the second input current to determine a faulty connection in the first termination point (202).

3. The system as claimed in claim 1, wherein the system determines a location of the faulty connection in the second equipment (102B) or the body of the second equipment (102B) more accurately by (i) changing (a) the third current injection point (120) to a frame (124) of the second equipment (102B) above a second termination point (302) where a pole structure (122) is bonded with the frame (124) and (b) the second current injection point (114) to the pole structure (122) below the second termination point (302), (ii) providing the second input current with off-grid frequency to (a) the frame (124) of the second equipment (102B) and (b) the pole structure (122) which acts a riser under test, (iii) measuring, using the second current measuring device (118), the second current that is received by the pole structure (122) from the frame (124) of the second equipment (102B), and (iv) comparing at least two of the first current, the second current, and the second input current to determine a faulty connection in the second termination point (302).

4. The system as claimed in claim 1, wherein the system determines a location of the faulty connection in the second equipment (102B) or the body of the second equipment (102B) more accurately by (i) changing the second current injection point (114) to the frame (124) of the second equipment (102B) below a third termination point (402) where the frame (124) is bonded with the second equipment (102B), (ii) providing the second input current with off-grid frequency to (a) the second equipment (102B) and (b) the frame (124) of the second equipment (102B) which acts a riser under test, (iii) measuring, using the second current measuring device (118), the second current that is received by the frame (124) of the second equipment (102B) from the second equipment (102B), and (iv) comparing at least two of the first current, the second current, and the second input current to determine a faulty connection in the third termination point (402).

5. The system as claimed in claim 4, wherein the current injection device (110) is electrically connected to the frame (124) of the second equipment (102B) or the pole structure (122) of the second equipment (102B) at the third current injection point (120) for providing the second input current with off-grid frequency.

6. The system as claimed in claim 1, wherein the first input current or the second input current ranges from 1 ampere to 20 amperes.

7. The system as claimed in claim 1, wherein the first input current or the second input current comprise an alternate current (AC) or a direct current (DC).

8. The system as claimed in claim 1, wherein the first reference riser (106A) is a conductor that connects the current injection device (110) and the earth grid (104).

9. The system as claimed in claim 1, wherein the first reference riser (106A) is a node taken from the earth grid (104) to provide the first input current from the current injection device (110) to the earth grid (104), wherein the second riser (108) is a node taken from the second equipment (102B) or the body of the second equipment (102B) to provide the second input current from the current injection device (110) to the second equipment (102B) or the body of the second equipment (102B).

10. The system as claimed in claim 1, wherein the second riser (108) under test is a conductor that is connected with (i) the second equipment (102B) or the body of the second equipment (102B) to receive the second input current from the second equipment (102B) or the body of the second equipment (102B) and (ii) the earth grid (104) to receive the first input current from the earth grid (104), wherein the second input current from the second equipment (102B) or the body of the second equipment (102B) and the first input current from the earth grid (104) are provided to the first current measuring device (116) and the second current measuring device (118) for measuring the first current and the second current respectively.

11. A method for detecting a faulty connection in an earth grid (104) or an equipment, wherein the earth grid (104) is connected to a plurality of equipment (102A-B), wherein a first equipment (102A) from the plurality of equipment (102A-B) is connected to the earth grid (104) through a plurality of first risers (106A-B) and a second equipment (102B) from the plurality of equipment (102A-B) is connected to the earth grid (104) through a second riser (108), wherein the method comprises:

modifying, using a frequency converter (502) of a current injection device (110) of a system, an input current with grid frequency into an input current with off grid frequency;

regulating, using a current unit (504) of the current injection device (110), the input current with off grid frequency into a variable input current with off grid frequency;

receiving, using a first reference riser (106A) and a second riser (108) of the system, a first input current with off-grid frequency from a current injection device (110) and providing the first input current with off-grid frequency to an earth grid (104) for detecting a faulty connection using the second riser (108) that is under test when the current injection device (110) is electrically connected to (i) the first reference riser (16A) from the plurality of the first risers (106A-B) at a first current injection point (112) and (ii) the second riser (108) at a second current injection point (114);

receiving, using a second equipment (102B) or a body of the second equipment (102B) and the second riser (108) of the system, a second input current with off grid frequency from the current injection device (110) and providing the second input current with off-grid frequency to the second riser (108) under test for detecting a faulty connection in the second equipment (102B) or the body of the equipment (102B) using the second riser (108) that is under test when the current injection device (110) is electrically connected to (i) a second equipment (102B) or a body of the second equipment (102B) at a third current injection point (120) and (ii) the second riser (108) at the second current injection point (114);

measuring, using a first current measuring device (116) of the system, a first current that is received by the second riser (108) from the earth grid (104);

measuring, using a second current measuring device (118) of the system, a second current that is received by the second riser (108) from the second equipment (102B) or the body of the second equipment (102B); and characterized in that, comparing, using the system, the first current, the second current, the first input current, and the second input current and determining a faulty connection in (i) the second equipment (102B) if at least one of (a) the second current that is received by the second riser (108) under test from the body of the second equipment (102B) is below the first current that is received by the second riser (108) under test from the earth grid (104), (b) the second current that is received by the second riser (108) under test from the second equipment (102B) is below the second input current that is provided to the body of the second equipment (102B), or (c) the second current that is received by the second riser (108) under test from the body of the second equipment (102B) is zero, and (ii) the earth grid (104) if at least one of (a) the first current that is received by the second riser (108)

under test from the earth grid (104) is below the second current that is received by the second riser (108) under test from the body of the second equipment (102B), (b) the first current that is received by the second riser (108) under test from the earth grid (104) is below the first input current that is provided to the earth grid (104), or (c) the first current that is received by the second riser (108) under test from the earth grid (104) is zero.

12. The method as claimed in claim 11, wherein the method comprises determining, using the system, a location of the faulty connection in the second equipment (102B) or the body of the second equipment (102B) more accurately by (i) changing the third current injection point (120) to a pole structure (122) of the second equipment (102B) above a first termination point (202) where the second riser (108) is terminated, (ii) providing the second input current with off-grid frequency at the third current injection point (120) and to the second current injection point (114), (iii) measuring, using the second current measuring device (118), the second current that is received by the second riser (108) from the pole structure (122) of the second equipment (102B), and (iv) comparing at least two of the first current, the second current and the second input current to determine a faulty connection in the first termination point (202).

13. The method as claimed in claim 11, wherein the method comprises determining, using the system, a location of the faulty connection in the second equipment (102B) or the body of the second equipment (102B) more accurately by (i) changing (a) the third current injection point (120) to a frame (124) of the second equipment (102B) above a second termination point (302) where a pole structure (122) is bonded with the frame (124) and (b) the second current injection point (114) to the pole structure (122) below the second termination point (302), (ii) providing the second input current with off-grid frequency to (a) the frame (124) of the second equipment (102B) and (b) the pole structure (122) which acts a riser under test, (iii) measuring, using the second current measuring device (118), the second current that is received by the pole structure (122) from the frame (124) of the second equipment (102B), and (iv) comparing at least two of the first current, the second current, and the second input current to determine a faulty connection in the second termination point (302).

14. The method as claimed in claim 11, wherein the method comprises determining, using the system, a location of the faulty connection in the second equipment (102B) or the body of the second equipment (102B) more accurately by (i) changing the second current injection point (114) to the frame (124) of the second equipment (102B) below a third termination point (402) where the frame (124) is bonded with the second equipment (102B), (ii) providing the second input current with off-grid frequency to (a) the second equipment (102B) and (b) the frame (124) of the second equipment (102B) which acts a riser under test, (iii) measuring, using the second current measuring device (118), the second current that is received by the frame (124) of the second equipment (102B) from the second equipment (102B), and (iv) comparing at least two of the first current, the second current, and the second input current to determine a faulty connection in the third termination point (402).

15. The method as claimed in claim 14, wherein the method comprises electrically connecting the current injection device (110) to the frame (124) of the second equipment (102B) or the pole structure (122) of the second equipment (102B) at the third current injection point (120) for providing the second input current with off-grid frequency.

* * * * *